(12) United States Patent
Morfill et al.

(10) Patent No.: US 10,470,285 B2
(45) Date of Patent: Nov. 5, 2019

(54) ELECTRODE ASSEMBLY AND PLASMA SOURCE FOR GENERATING A NON-THERMAL PLASMA, AND METHOD FOR OPERATING A PLASMA SOURCE

(71) Applicant: terraplasma GmbH, Garching (DE)

(72) Inventors: Gregor Morfill, München (DE); Tetsuji Shimizu, Ibaraki (JP); Yangfang Li, Olching (DE)

(73) Assignee: terraplasma GmbH, Garching (DE)

( * ) Notice: Subject to any disclaimer, the term of this patent is extended or adjusted under 35 U.S.C. 154(b) by 0 days.

(21) Appl. No.: 15/744,913

(22) PCT Filed: Jul. 21, 2016

(86) PCT No.: PCT/EP2016/067418
§ 371 (c)(1),
(2) Date: Jan. 15, 2018

(87) PCT Pub. No.: WO2017/013211
PCT Pub. Date: Jan. 26, 2017

(65) Prior Publication Data
US 2018/0206321 A1  Jul. 19, 2018

(30) Foreign Application Priority Data
Jul. 23, 2015  (DE) .......... 10 2015 213 975

(51) Int. Cl.
*H01J 27/00* (2006.01)
*H05H 1/24* (2006.01)
(Continued)

(52) U.S. Cl.
CPC ..... *H05H 1/2406* (2013.01); *H01J 37/32532* (2013.01); *H01J 49/10* (2013.01);
(Continued)

(58) Field of Classification Search
CPC .... H05H 2001/2412; H05H 1/46; H01J 49/10
(Continued)

(56) References Cited

U.S. PATENT DOCUMENTS 6,433,480 B1 * 8/2002 Stark .............. H01J 61/09
313/306
6,624,583 B1 * 9/2003 Coll .............. B01D 53/323
313/581

(Continued)

FOREIGN PATENT DOCUMENTS

CN  201805613 U  4/2011
CN  102892671 A  1/2013
(Continued)

OTHER PUBLICATIONS

International Preliminary Report on Patentability for corresponding Patent Application No. PCT/EP2016/067418 dated Jan. 23, 2018.
(Continued)

*Primary Examiner* — Thuy V Tran
(74) *Attorney, Agent, or Firm* — Renner, Otto, Boisselle & Sklar, LLP (57) ABSTRACT

The invention relates to an electrode assembly (5) for generating a non-thermal plasma, comprising a first electrode (7) and a second electrode (9) which are electrically insulated from each other by means of a dielectric element (11) and which are arranged at a distance from each other. The first electrode (7) has a thickness of at least 10 μm when seen in the direction of the distance between the electrodes (7, 9), and the second electrode (9) has a thickness of at least 1 μm to maximally 5 μm or a thickness of at least 5 μm to maximally 30 μm when seen in the direction of the distance between the electrodes (7, 9). The dielectric element (11) has a thickness of at least 10 μm to maximally 250 μm.

20 Claims, 2 Drawing Sheets

(51) Int. Cl.
*H01J 37/32* (2006.01)
*H05H 1/46* (2006.01)
*H01J 49/10* (2006.01)

(52) U.S. Cl.
CPC ....... *H05H 1/46* (2013.01); *H05H 2001/2412* (2013.01); *H05H 2001/2418* (2013.01)

(58) Field of Classification Search
USPC .............................................. 250/423 R, 424
See application file for complete search history.

(56) References Cited

U.S. PATENT DOCUMENTS

| | | | | |
|---|---|---|---|---|
| 6,703,784 B2 * | 3/2004 | Vonallmen | ................ | H01J 9/18 |
| | | | | 313/485 |
| 8,101,923 B2 * | 1/2012 | Orlando | ................ | H01J 49/162 |
| | | | | 250/281 |
| 8,927,052 B2 * | 1/2015 | Dubreuil | ................ | B05D 1/62 |
| | | | | 427/8 |
| 2011/0253842 A1 | 10/2011 | Silkey et al. | | |
| 2014/0207053 A1 | 7/2014 | Morfill et al. | | |

FOREIGN PATENT DOCUMENTS

| | | |
|---|---|---|
| EP | 2 322 272 A1 | 5/2011 |
| WO | 2009/015371 A2 | 1/2009 |
| WO | 2011/133807 A2 | 10/2011 |
| WO | 2012/150041 A1 | 11/2012 |

OTHER PUBLICATIONS

International Search Report and Written Opinion for corresponding Patent Application No. PCT/EP2016/067418 dated Oct. 12, 2016.
Chinese Office Action for corresponding Chinese Patent Application No. 201680043155.0 dated Aug. 16, 2019.

* cited by examiner

ELECTRODE ASSEMBLY AND PLASMA SOURCE FOR GENERATING A NON-THERMAL PLASMA, AND METHOD FOR OPERATING A PLASMA SOURCE

The invention relates to an electrode arrangement and plasma source for generating a nonthermal plasma, as well as a method for operating a plasma source.

BACKGROUND

Electrode arrangements for generating a nonthermal plasma typically have a first electrode and a second electrode, wherein the electrodes are electrically insulated from each other by a dielectric element and are spatially separate from each other. Typical uses for such electrode arrangements, or the nonthermal plasmas generated by such electrode arrangements, are found in the fields of disinfection or sterilization, surface functionalization, as well as the medical field, in particular wound disinfection, wound treatment and healing, treating skin irritations, as well as treating bacterial, viral and fungal skin diseases. It was revealed that a chemical composition of the plasma generated by the electrode arrangement strongly depends on a distance measured at a right angle from an active surface of the electrode arrangement as described in the international application with publication number WO 2012/150041 A1, as well as US application US 2014/0207053 A1. Depending on the specific application, a different chemical composition is desirable, and thus also a different treatment distance between a surface to be treated and the active surface of the electrode arrangement. A relevant range of distance for adjusting the plasma chemistry is for example between 2 and 4 mm. Conventional electrode arrangements can however only be operated efficiently at comparably high voltage amplitudes, and therefore, for reasons of electrical safety, it is very difficult to move them close enough toward the surfaces to be treated, such as the skin of the patient, or only by taking a great amount of time, so that the plasma chemistry can scarcely be adjusted in a desirable and flexible manner. Moreover, conventional electrode arrangements are designed comparatively large and in particular rigid, which stands in the way of a miniaturization of devices that possess such an electrode arrangement, as well as a geometrically flexible use of the electrode arrangement.

SUMMARY OF THE INVENTION

The object of the invention is to create an electrode arrangement, as well as a plasma source for generating a nonthermal plasma and a method for operating a plasma source, wherein the aforementioned disadvantages do not occur.

The object is achieved by creating the objects of the independent claims. Advantageous embodiments will become apparent from the dependent claims.

The object is achieved in particular by creating an electrode arrangement for generating a nonthermal plasma that has a first electrode and a second electrode, wherein the first electrode and the second electrode are electrically insulated from each other by a dielectric element, and are spatially separate from each other by the dielectric element, in particular continuously, i.e., in particular without interruption along its entire extension. The electrode arrangement is distinguished in that the first electrode, viewed in the direction of the spacing of the electrodes from each other, has a thickness of at least 10 μm, wherein the second electrode, also viewed in the direction of the spacing of the electrodes from each other, has a thickness of at least 1 μm to at most 5 μm, or a thickness of at least 5 μm to at most 30 μm. Consequently, the dielectric element, viewed in the direction of the spacing of the electrodes from each other, has a thickness of at least 10 μm to at most 250 μm. Given the very thin design of the electrodes in the dielectric element, it is possible to create a smaller and in particular thinner electrode arrangement than known previously that is suitable to be operated at voltage amplitudes that permit a significantly reduced safe distance from a treated surface. It is therefore possible to flexibly adjust the plasma chemistry to the desired application, and in particular to advance into ranges of distance that were previously infeasible for reasons of electrical safety. Accordingly, an appropriate plasma chemistry can be selected for each desired application, and a corresponding distance from the treated surface can be ensured. Moreover given the chosen very thin electrodes and the dielectric element also chosen very thin, the electrode arrangement is designed as a thin layer electrode arrangement and is accordingly pliable and/or flexible overall so that a miniaturization of the device possessing the electrode arrangement is possible, and wherein the electrode arrangement per se can be used in an extremely flexible manner geometrically, and can in particular be adapted to a geometric shape of a surface to be treated. To accomplish this, a specific shape of the electrode and/or dielectric element during production is unnecessary; instead, the overall electrode arrangement, given its property of flexibility, can be easily adapted to the geometry of the surface to be treated, especially by bending.

Preferably, the second electrode possesses a thickness of at least 5 μm to at most 30 μm.

Preferably, the second electrode possesses a thickness of at least 1 μm to at most 5 μm.

The electrode arrangement is in particular configured for generating surface microdischarges.

If a difference in potential, in particular an alternating voltage, is applied to the two electrodes, surface microdischarges form on an active surface of the electrode arrangement that in turn cause a nonthermal plasma to be generated in the region of the active surface.

For this, the first electrode and second electrode are in particular designed as power electrodes.

The first electrode and second electrode are arranged superimposed, i.e., in particular on two planes offset from each other, or are spaced from each other by the dielectric element, in particular in the form of a sandwich-like stack. Accordingly, an electric field can be generated by a voltage perpendicular to a surface of the dielectric when a difference in potential is applied between the two electrodes.

An upper limit of the thickness of the first electrode is preferably chosen such that the electrode arrangement is pliable and flexible overall. In particular, an upper limit of at most 250 μm, preferably at most 30 μm, is preferably selected for the thickness of the first electrode.

The lower limit for the thickness of the first electrode is preferably selected to minimize resistive loss.

It is therefore apparent that the electrode arrangement is preferably designed pliable, in particular flexible.

The dielectric element is in particular arranged between the first electrode and the second electrode so that, on the one hand, the electrodes are geometrically spaced from each other by the dielectric element and, other on the other hand, are electrically insulated from each other. The arrangement is selected in particular so that the first electrode has physical contact with the dielectric element, wherein no air gap is provided between the first electrode and the dielectric element, wherein the second electrode has physical contact with the dielectric element, wherein no air gap is provided between the second electrode and the dielectric element.

The first electrode, the dielectric element and the second electrode preferably thus form a stack, wherein the direction of the spacing of the electrodes from each other by the dielectric element corresponds to a stack direction. Correspondingly, the aforementioned thicknesses are measured in the stack direction. A nonthermal plasma is in particular understood to be a plasma in which a temperature describing the distribution of the kinetic energy of the electrons of plasma, also termed the electron temperature, is not identical and in particular is much higher than a temperature describing the distribution of the kinetic energy of the ions comprised by the plasma, in particular atomic ions or molecular ions, which is also termed the ion temperature. The electron temperature is significantly higher than the ion temperature, wherein the ion temperature can in particular be selected within a range of 25° C. to at most 100° C. Given the comparatively low ion temperature, such a plasma is also termed a cold plasma.

In this context, a plasma designates in particular a material state in which charged particles with opposing charges exist next to each other in the gas phase, wherein averaged over a specific volume, a neutral electric charge results for the considered volume. The plasma also preferably comprises non-charged atoms and molecules that are in electronically, vibrationally or rotationally excited states, and that also are termed excited particles and/or free radicals, overall in particular non-charged reactive atoms and/or molecules that are also termed reactive particles or reactive species. The chemical composition of the plasma changes in particular depending on a distance measured perpendicular to an active surface of the electrode arrangement at which the plasma is formed.

An exemplary embodiment of the electrode arrangement is preferred which is distinguished in that the second electrode possesses a dielectric cover element on a side facing away from the dielectric element that, viewed in the stack direction, has a thickness of at least 0.2 µm to at most 30 µm. The dielectric cover element serves to protect the second electrode from damage, in particular from chemical or mechanical erosion, and simultaneously prevents direct contact between a treated surface and the second electrode. Given the very thin design of the dielectric cover element, the electrode arrangement is pliable, in particular flexible, even when it possesses the dielectric cover element.

In a preferred exemplary embodiment, the dielectric cover element is designed as a coating, wherein in particular the second electrode is coated with the dielectric cover element.

The electrode arrangement is preferably configured so that the nonthermal plasma, viewed from the dielectric element, is generated on the side of the second electrode, in particular on the surface of the second electrode, or on a surface of the dielectric element facing away from the second electrode.

The dielectric cover element serves in particular as a protective coating, in particular for guaranteeing the electrical safety of the electrode arrangement for an operator, and/or for parts treated with the nonthermal plasma.

It was revealed that especially in terms of electrical safety, the ratio of the thickness of the dielectric element to the thickness of the dielectric cover element is preferably at least 5 to at most 15, preferably at least 8 to at most 12, preferably 10.

An exemplary embodiment of the electrode arrangement is preferred that is distinguished in that the first electrode has a dielectric base element on a side facing away from the dielectric element. With the assistance of the dielectric base element, it is preferably possible to prevent or suppress corona discharges proceeding from the first electrode that would otherwise reduce efficiency of the electrode arrangement. A thickness of the dielectric base element measured in the stack direction is preferably chosen such that, on the one hand, the corona discharges that proceed from the first electrode are effectively and efficiently, preferably completely suppressed, wherein on the other hand, the electrode arrangement remains pliable overall, in particular flexible. It is in particular possible for the dielectric base element to possess a thickness of at least 10 µm to at most 250 µm, preferably at most 30 µm.

The dielectric base element is preferably designed flat and extends particularly preferably along an overall extension of the first electrode. In a preferred exemplary embodiment, the dielectric base element is designed as a coating, wherein the first electrode is coated with the dielectric base element, in particular on its side facing away from the dielectric element.

An exemplary embodiment of the electrode arrangement is preferred that is distinguished in that the at least one electrode, selected from the first electrode and the second electrode, has a material or consists of a material that is selected from a group consisting of copper, silver, gold and aluminum. Other conductive materials, in particular metals or metalloids can also be used to produce the at least one electrode. It is also possible to produce at least one of the first and second electrodes from a metal alloy, in particular an alloy that has at least one of the aforementioned elements. It is important for the electrodes to be produced from a conductive material, preferably with minimal electrical resistance.

An exemplary embodiment of the electrode arrangement is also preferred that is distinguished in that at least one element selected from the dielectric element, dielectric cover element and dielectric base element has a material or consists of a material, wherein the material selected from the group consisting of silicon nitride (SiN), a silicate, in particular quartz ($SiO_2$), a glass and a plastic, in particular polyamide. Other inorganic or organic materials are also possible for the element. It is important for the selected material to have dielectric properties and in particular be designed nonconductive, in particular as an electrical insulator.

An exemplary embodiment of the electrode arrangement is preferred which is distinguished in that the first electrode is designed flat. Particularly preferably, the first electrode is designed as a layer electrode or leaf electrode. This enables a homogeneous distribution of the generated plasma, and a particularly homogeneous distribution of the output therefor.

One preferred exemplary embodiment provides that the second electrode is designed structured. The second electrode can in particular be tailored in terms of its geometric structure to specific requirements for the electrode arrangement, in particular to a specific use of the electrode arrangement.

One preferred exemplary embodiment of the electrode arrangement provides that the second electrode has a comb-like structure. In particular, this designates a structure in which the second electrode has an elongated base element, proceeding from which electrode branches extend that are oriented parallel to each other and electrically connected to the base element. It is also possible for the second electrode to have a linear structure, wherein the linear structure has at least one straight line. Preferably, the linear structure has a plurality of lines that are in particular arranged parallel to each other and electrically connected to each other. In particular, a comb-like structure with a base element can be provided, wherein linear electrode branches that are arranged parallel to each other extend proceeding from the base element and are electrically connected to the base element.

It is also possible for the second electrode to have a winding structure, in particular a wavy structure. It is in particular possible for the second electrode to be designed as a wavy line. It can also be preferably provided that the second electrode has a plurality of wavy lines arranged parallel to each other that are electrically connected to each other. In particular, a comb-like structure is also possible in which electrode branches, proceeding from a base element, extend in the form of wavy lines and are electrically connected to the base element and preferably oriented parallel to each other.

It is also possible for the second electrode to have a spiral structure, in particular in the form of a circular spiral or angular spiral, or for the second electrode to have a meandering structure.

If the second electrode has a line or plurality of lines, for example in the form of a wavy line or a straight line, or in the form of a spiral or meandering line, such a line of the second electrode preferably has a width of at least 50 μm to at most 200 μm. Such a width has proven to be particularly beneficial on the one hand with regard to the electrical properties of the electrical arrangement and the properties of the generated plasma and, on the other hand, with regard to the pliability and flexibility of the electrode arrangement.

A preferred exemplary embodiment provides that the second electrode has a flat structure with at least one recess. This means in particular that the second electrode is designed flat, wherein it has at least one recess, preferably at least one penetration, in particular in its surface. In this case, surface microdischarges can be generated, in particular in the at least one recess. The surface microdischarges are generated in particular at edges of the at least one recess.

It was revealed that edges of the at least one recess preferably have a distance relative to each other of at least 0.5 mm, and preferably more than 0.5 mm. In particular, the at least one recess preferably has a width of at least 0.5 mm, preferably more than 0.5 mm.

Numeric simulations of the electrode arrangement have shown that the electrical field at the edges of such a recess in the second electrode has an extension of approximately 30 μm to 50 μm. At two opposing edges of such a recess, microdischarges can therefore arise in two regions with an extension perpendicular to the edge of approximately 30 μm to 50 μm in each case. To prevent interference with and weakening of the electrical field and hence the discharges as well, a spacing between the edges must therefore be chosen that is much greater than twice the extension of the individual microdischarges, i.e., greater than 60 μm to 100 μm. It was revealed that a spacing of the edges of the recess from each other of at least 500 μm, preferably more than 500 μm, i.e., 0.5 μm is sufficient to provide unattenuated surface microdischarges with a high degree of efficiency.

The at least one recess is preferably designed like an engraved structure in the second electrode.

Preferably, the at least one extension forms a symbol accessible to human understanding or recognizable by human understanding such as a pictogram, symbol, at least one letter, a number or word such as a name, or an image such as a face, or an object, logo, etc. In this regard, it is possible for the second electrode to have a plurality of recesses that can form different symbols accessible to human understanding, or jointly form a symbol accessible to human understanding.

According to a development of the invention, the first electrode, perpendicular to the stack direction, projects at least sectionally, preferably entirely, beyond a margin of the second electrode. In this case, surfaces can generate microdischarges on an outer edge as well, i.e., an outer peripheral line or edge of the second electrode.

Alternatively or in addition, it is possible for the first electrode, viewed perpendicular to the stack direction, to have, at least sectionally, a lesser extension than the second electrode so that the second electrode projects at least sectionally, preferably entirely in this direction beyond the first electrode. In this case, at least where the second electrode projects laterally beyond the first electrode, i.e., perpendicular to the stack direction, it is possible for no microdischarges to be generated at the peripheral edge of the second electrode.

Viewed perpendicular to the stack direction, the dielectric element preferably extends beyond the outer peripheral lines of both electrodes, i.e., of the first electrode and second electrode.

It is moreover possible for the second electrode to be arranged on the dielectric element, in particular to be deposited thereupon, for example by physical vapor deposition, etc. It is however also possible for the second electrode to be embedded in the dielectric element.

One preferred exemplary embodiment of the electrode arrangement provides that the dielectric element is designed flat. It is in particular possible for the dielectric element to be designed as a coating on the first electrode, wherein the second electrode is preferably constructed on the dielectric element, or is produced as a possibly local coating on the dielectric element.

Alternatively or in addition, the dielectric cover element is preferably designed flat, wherein it preferably entirely houses or encapsulates the second electrode and thus protects it from contact with a surface to be treated as well as from damage, in particular chemical or mechanical erosion.

Alternatively or in addition, the dielectric base element is preferably designed flat, and thus protects in particular one of the two sides of the first electrode facing away from the second electrode from external influences.

An exemplary embodiment of the electrode arrangement is preferred that is distinguished in that at least one element selected from the dielectric element, dielectric cover element and dielectric base element has an average surface roughness Ra that is less than 5% of the thickness of the element. A surface roughness Ra of the dielectric element and/or the dielectric cover element is particularly preferable. Given the very slight surface roughness of at least one of these elements, a very homogeneous and even output distribution of the nonthermal plasma generated by means of the electrode arrangement can be guaranteed. In particular, local output peaks and minimum outputs are largely avoided.

In this context, an average surface roughness is designated in particular an average distance of an imaginary measuring point on the relevant surface to an imaginary midline of the relevant surface. Within a reference section, the imaginary midline intersects the surface profile such that a sum of the profile deviations is minimal with respect to the imaginary midline. Accordingly, the average roughness Ra corresponds to the arithmetic mean of the quantitative deviation from the imaginary midline.

The average roughness Ra is preferably measured using an optical method. Particularly preferably, the average roughness is determined by means of a method as defined in the standard ISO 25178 in the version valid on the date establishing the seniority of the present application. To determine the average roughness, a confocal method, a conoscopic hologram, optical waveguide interferometry and/or focus variation can be used. An airflow method is also possible, for example to determine a smoothness according to Bekk, a smoothness according to Parker print surface or a smoothness according to Bendtsen. Preferably, an average surface roughness Ra of the considered element results for each of the aforementioned measuring methods that is less than 5% of the thickness of the relevant element.

In addition or alternatively, it is preferably provided that a thickness variation of at least one element selected from the dielectric element, dielectric cover element and dielectric base element is less than 5% of the thickness of the relevant element. This is particularly preferable for the dielectric element and/or the dielectric cover element. This as well yields improved homogeneity of the output distribution of the generated plasma.

The object is also achieved in that a plasma source is created for generating a nonthermal plasma that has a voltage source and an electrode arrangement according to one of the above-described exemplary embodiments. The voltage source is electrically connected to at least the first electrode. In conjunction with a plasma source, the advantages result that were explained with regard to the electrode arrangement.

Since the voltage source is electrically connected to at least the first electrode, it means in particular that an electric voltage or an electric signal, in particular an AC voltage is applied to the first electrode.

It is preferably provided that the second electrode is earthed or is grounded. This increases the electrical safety of the plasma source since the second electrode is arranged closer to a surface to be treated than the first electrode. If for example a break occurs when bending the flexible electrode arrangement and part of the second electrode exits the dielectric cover element, there is no danger from this part of the second electrode contacting the treated surface, in particular the skin of the patient, when the second electrode is earthed or grounded.

In a preferred exemplary embodiment of the plasma source, it is provided that the voltage source is also electrically connected to the second electrode. Particularly preferably, the second electrode is grounded or earthed via the voltage source.

Alternatively, it is also possible for the voltage source to only be electrically connected to the first electrode, wherein preferably the voltage source can be connected on the one hand and the second electric source can be connected on the other hand to a common earth point or common ground point.

An exemplary embodiment of the plasma source is preferred that is distinguished in that an AC voltage can be applied to the first electrode, wherein the second electrode is earthed. As mentioned above, this can be done through the voltage source, or outside of the voltage source by contacting the second electrode to an earth or ground point.

An exemplary embodiment of the plasma source is also possible in which the second electrode does not have a specific electric potential and thus floats.

An exemplary embodiment of the plasma source is preferred which is distinguished in that the plasma source, preferably the voltage source, is configured to generate an AC voltage that has an amplitude of at least 0.5 kV from tip to tip which is also termed $kV_{pp}$, to at most 3 $kV_{pp}$, preferably from at least 1.0 $kV_{pp}$ to at most 2.5 $kV_{pp}$, preferably from at least 1.0 $kV_{pp}$ to at most 2.0 $kV_{pp}$, preferably 1.5 $kV_{pp}$, and/or at a frequency of at least 20 kHz to at most 90 kHz, preferably from at least 30 kHz to at most 80 kHz, preferably from at least 40 kHz to at most 70 kHz, preferably from at least 50 kHz to at most 60 kHz, preferably 50 kHz. Given the very thin design of the electrode arrangement, it is possible to apply an AC voltage that has a comparatively low amplitude to the first electrode. This increases the electrical safety of the plasma surface and minimizes a safe distance to be maintained between a surface to be treated and the surface of the electrode arrangement at which the plasma is generated.

Accordingly, it is flexibly possible to adjust an optimum plasma chemistry and therefore an optimum chemical composition of the generated plasma for a specific desired type of treatment of the surface to be treated. In particular, it is possible to select a treatment distance of at least a 2 mm to at most 4 mm.

The very thin geometric design of the electrode embodiment makes it possible to additionally or alternately select a frequency for the AC voltage that lies above a maximum audio frequency, i.e., in particular above 20 kHz. This is also especially promoted because the first electrode is preferably designed flat or as a layer electrode or leaf electrode, which minimizes the leakage capacity of the electrode arrangement.

The choice of such high frequencies above the maximum audio frequency increases the electrical safety of the plasma source on the one hand, and on the other hand piezoamplifiers can be used, in particular when a frequency of at least 50 kHz is chosen. This in turn permits a further miniaturization of the plasma source because such piezoamplifiers can be designed very small. In particular, such a piezoamplifier can have a thickness of approximately 2 mm, a width of approximately 8 mm, and a length of approximately 50 mm. It is accordingly possible to provide a plasma source that for example has the size of a pencil. In the final analysis, the plasma source per se is no longer restrictive to the size of a plasma device that has the plasma source; instead, it has the size of an electrical storage device for supplying the voltage source with electrical power if it is a portable, mains-independent device. In particular, the size of the battery is restrictive of the possible miniaturization of the corresponding device.

In particular, an exemplary embodiment of the plasma source is preferred that is distinguished in that the plasma source, in particular the voltage source, has a piezoamplifier. This yields the above-described advantage of a smaller design and improved options for miniaturizing the plasma source.

Such piezoamplifiers or piezotransformers can be operated optimally at a frequency of about 50 kHz since their resonance frequency lies within this range. Moreover, they are optimally operated at a voltage of at most 3 $kV_{pp}$. Both enable the electrode arrangement proposed here given their low electrical capacitance which prevents otherwise high loss, and given the possibility of operating them at a comparatively low AC voltage amplitude.

The object is lastly achieved by creating a method for operating a plasma source, wherein within the context of the method, electrical voltage is applied to the electrode arrangement according to one of the above-described exemplary embodiments by means of a voltage source, and/or wherein a plasma source is operated according to one of the above-described exemplary embodiments. In conjunction with the method, the advantages are realized in particular that were already explained in conjunction with the electrode arrangement and/or with the plasma source.

In particular, surface microdischarges are generated in the context of the method. By varying the electrical parameters of the plasma source, a plasma chemistry of the plasma generated by the surface microdischarges can be modified.

An embodiment of a method is preferred that is distinguished in that an AC voltage with an amplitude of at least 0.5 $kV_{pp}$ to at most 3 $kV_{pp}$, preferably at least 1.0 $kV_{pp}$ to at most 2.5 $kV_{pp}$, preferably at least 1.0 $kV_{pp}$ to at most 2.0 $kV_{pp}$, and preferably 1.5 $kV_{pp}$ is generated. In particular, this yields the advantage of increased electrical safety while operating the plasma source, and of an appropriate selection of distance of the plasma source to a treated surface in a manner that is highly flexible and adapted to the application so that the plasma chemistry can always be flexibly and suitably adjusted.

An embodiment of the method is also preferred in which the AC voltage is generated at a frequency of at least 20 kHz to at most 90 kHz, preferably at least 30 kHz to at most 80 kHz, preferably at least 40 kHz to at most 70 kHz, preferably at least 50 kHz to at most 60 kHz, and preferably 50 kHz. On the one hand, this yields the advantage of increased electrical safety when operating the plasma source, and on the other hand the advantage that piezoamplifiers can be used which in turn enables a miniaturization of the plasma source.

A device for the plasma treatment of an object, in particular a surface that has an electrode arrangement and/or plasma surface according to one of the above-described exemplary embodiments, is also part of the invention.

Moreover, the invention also includes use of an electrode arrangement and/or a plasma source for surface functionalization, in particular to achieve improved adhesion, improved coatings such as paint or varnish; for use in hygiene, for example for disinfecting or sterilizing equipment, in particular medical equipment, for hand disinfection or hand sterilization, for surface disinfection or surface sterilization; and/or for use in the medical field, for example for wound disinfection or wound healing, for treating skin irritations, for treating bacterial or viral diseases of the skin, and fungal diseases of the skin.

The first electrode and the second electrode are preferably fully encapsulated in nonconductive and/or dielectric material which increases the safety of the electrode arrangement.

Overall, the following advantages also result in conjunction with the electrode arrangement, plasma source and method:

Due to the very thin design of the electrode arrangement, it can be bent very easily so that a flexible design in the production of devices that have the electrode arrangement and/or the plasma source is possible.

A small voltage source can be used because the majority of the voltage source is an amplifier, ultimately in particular a transformer, which permits a reduction of the size of the amplifier due to the low AC voltage.

Moreover, greater conversion efficiency of the output of the voltage source to the operating voltage is possible, for example when converting a DC voltage to an AC voltage because less amplification is required. This in turn permits further miniaturization of the voltage source and hence the plasma source.

Due to the greater electrical safety, it is possible to reduce the thickness of an insulator material in a housing of the electrode arrangement where the plasma source is so that smaller safe distances are possible.

The variable width of distances between the electrode arrangement and a surface to be treated is increased. Accordingly, the composition of the plasma with regard to the reactive species on the surface to be treated covered by the plasma can be controlled more easily and appropriately selected depending on the desired application.

In the event of an accident or a malfunction, the risk of an electric shock to the operator of the electrode arrangement or the plasma source, and to the treated surface, in particular the skin of the patient, is minimized. The maximum electrical current is determined by the voltage used that can be reduced due to the geometric design of the electrode arrangement.

Given the increased electrical safety and accordingly reduced safety requirements, in particular greater design freedom in the structure of the electrode arrangement is possible.

BRIEF DESCRIPTION OF THE DRAWINGS

The invention will be further explained below with reference to the drawing. In the drawing.

DETAILED DESCRIPTION

Figure 1:
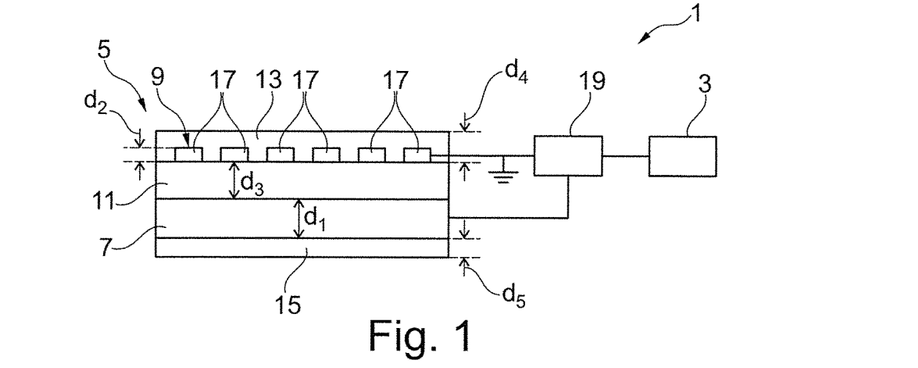
FIG. 1 shows a schematic representation of an exemplary embodiment of a plasma source.

FIG. 1 shows a schematic representation of an exemplary embodiment of a plasma source 1 that is configured to generate a nonthermal plasma. The plasma source 1 has a voltage source 3 that is electrically connected to an electrode arrangement 5. For its part, the electrode arrangement 5 is configured to generate a nonthermal plasma.

It has a first electrode 7 and a second electrode 9, wherein between the first electrode 7 and the second electrode 9, a dielectric element 11 is arranged so that the two electrodes 7, 9 are electrically insulated from each other and spaced from each other by the dielectric element 11. The two electrodes 7, 9 and the dielectric element 11 form a stack, wherein viewed in the stack direction, the dielectric element is arranged on the first electrode 7, and the second electrode 9 is arranged on the dielectric element 11.

Viewed in the stack direction, the first electrode 7 has a first thickness $d_1$ of at least 10 μm, wherein the second electrode 9, also viewed in the stack direction, has a second thickness $d_2$ of at least 1 μm to at most 5 μm, or from at least 5 μm to at most 30 μm. Viewed in the stack direction, the dielectric element has a third thickness $d_3$ of at least 10 μm to at most 250 μm.

The electrode arrangement 5 is accordingly designed as a thin layer electrode arrangement and has a very slight thickness overall. This renders it pliable overall so that it can be flexibly adapted to a plurality of different uses, and in particular to a plurality of geometrically different surfaces to be treated. Moreover, the electrode arrangement 5 can be operated at a low voltage, in particular at less than 3 $kV_{pp}$, due to its very thin design which increases the electrical safety of the plasma arrangement 1.

The second electrode 9 has a dielectric cover element 13 on a side facing away from the dielectric element 11 that has a fourth thickness $d_4$ of at least 0.2 µm to at most 30 µm viewed in the stack direction.

The dielectric cover element 13 is preferably designed as a coating, wherein in particular the second electrode 9 is coated with the dielectric cover element 13, or with the material of the dielectric cover element 13. The dielectric cover element 13 thereby covers the second electrode 9 preferably completely.

The first electrode 7 has a dielectric base element 15 on the side facing away from the dielectric element 11. This is advantageously designed flat and extends along an overall extension of the first electrode 7 and therefore entirely covers it, at the bottom in FIG. 1. Consequently, the dielectric base element 15 very efficiently prevents coronal discharges that could otherwise proceed from the first electrode 7 so that the efficiency of the electrode arrangement 5 is increased by the electric base element 15. A fifth thickness $d_5$ of the dielectric base element 15 is preferably selected so that on the one hand coronal discharges emitted by the first electrode 7 are reliably avoided, wherein on the other hand, the electrode arrangement 5 is designed pliable overall.

Overall, a stacked electrode arrangement 5 results with the following stack sequence: On the dielectric base element 15, the first electrode 7 is arranged on which the dielectric element 11 is arranged. The second electrode 9, on which the dielectric element 13 is arranged, is arranged thereupon.

The at least one first electrode 7 and/or the at least one second electrode 9 preferably has/have a material that is selected from a group consisting of copper, silver, gold and aluminum. Preferably, at least one of the first and second electrodes 7, 9 consist of the aforementioned materials.

Other conductive materials are possible for the electrodes 7, 9, in particular alloys as well, particularly preferably based on at least one of the aforementioned elements.

The dielectric element 11, the dielectric cover element 13 and/or the dielectric base element 15 preferably has/have a material that is selected from the group consisting of silicon nitride, a silicate, in particular quartz, a glass, and a plastic, in particular polyamide. It is also possible for at least one of the aforementioned elements to consist of one of the aforementioned materials. Other inorganic or organic materials are also possible for the aforementioned elements as long as they have dielectric and in particular electrically insulating properties.

The first electrode 7 is preferably designed flat, in particular as a layer or leaf electrode.

The second electrode 9 is preferably designed structured. In particular, in the exemplary embodiment shown in FIG. 1, it has a plurality of linear partial electrodes 17. The structure of the second electrode 9 can in particular be tailored to a specifically designed use of the electrode arrangement 5.

In particular, the dielectric element 11 and/or the dielectric cover element 13 preferably have an average surface roughness Ra that is less than 5% of the thickness of the respective element. Alternatively or in addition, the dielectric base element 15 preferably has an average surface roughness Ra that is less than 5% of its thickness.

The voltage source 3 is in particular electrically connected to the first electrode 7, wherein an AC voltage can be applied to the first electrode 7. The second electrode 9 is preferably earthed or grounded. In the exemplary embodiment described here, both electrodes 7, 9 are electrically connected by an amplifier 19 to the voltage source 3. The amplifier 19 is preferably designed as a piezoamplifier.

The electrode arrangement 5 is preferably operated with an AC voltage with an amplitude that is at least $0.5\ kV_{pp}$ to at most $3\ kV_{pp}$, preferably at least $1.0\ kV$ to at most $2.5\ kV_{pp}$, preferably at least $1.0\ kV_{pp}$ to at most $2.0\ kV_{pp}$, preferably $1.5\ kV_{pp}$. The AC voltage preferably has a frequency of at least 20 kHz to at most 90 kHz, preferably at least 30 kHz to at most 80 kHz, preferably at least 40 kHz to at most 70 kHz, preferably at least 50 kHz to at most 60 kHz, and preferably 50 kHz.

Figure 2:
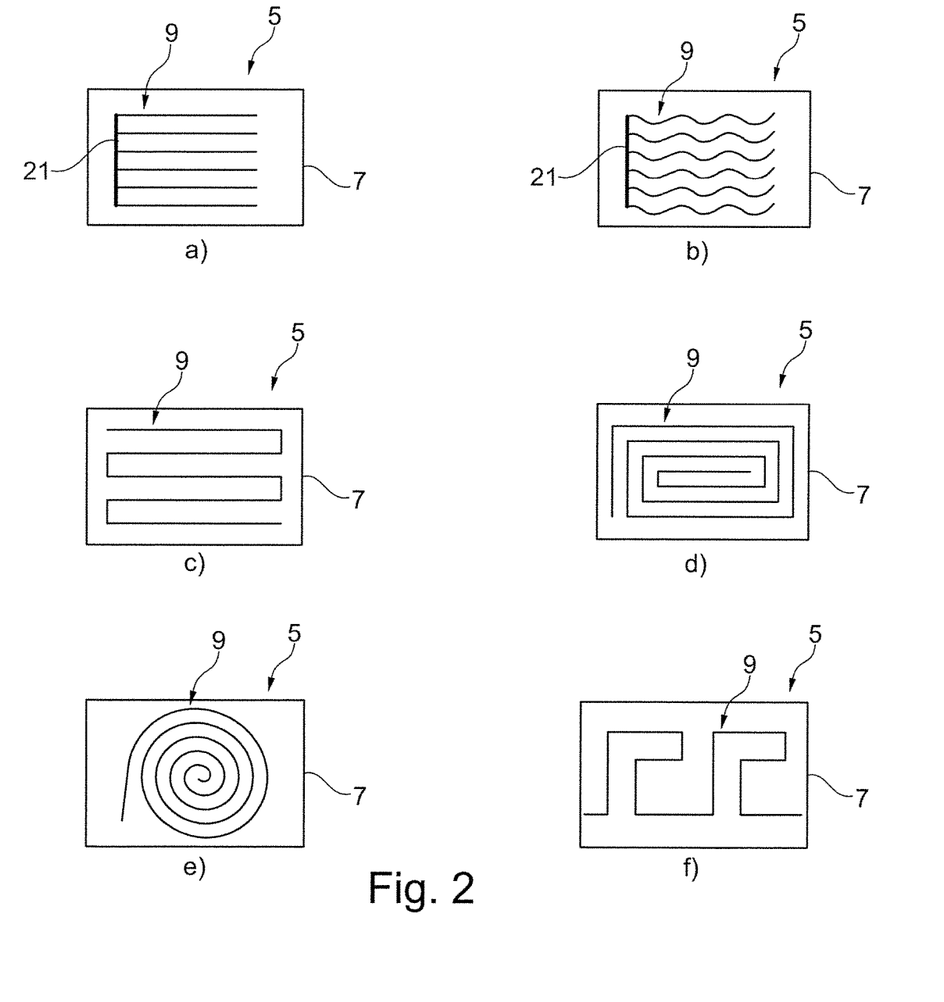
FIG. 2 shows a plurality of different exemplary embodiments of an electrode arrangement with respect to a structure of the second electrode.

FIG. 2 shows a plurality of different exemplary embodiments of the electrode arrangement 5, wherein the first flat electrode 7 and the structured second electrode 9 are schematically portrayed in a plan view.

A second electrode 9 is portrayed in FIG. 2a) that has a comb-like structure with a plurality of straight lines that are arranged parallel to each other, are electrically connected to each other, and extend to the right proceeding from common base element 21 in FIG. 2a).

In FIG. 2b), the second electrode 9 also has a comb-like structure, wherein serpentine partial electrodes extend parallel to each other proceeding from the base element 21. The individual partial electrodes are electrically connected to each other by the common base element 21.

In FIG. 2c), the second electrode 9 also has a linear structure, however in the form of a path running as an angular zigzag line.

In FIG. 2d), the second electrode 9 has the shape of an angular spiral.

In FIG. 2e), the second electrode 9 has the shape of an round spiral, in particular a circular spiral.

Finally, the second electrode 9 in FIG. 2f) has a meandering structure.

Figure 3:
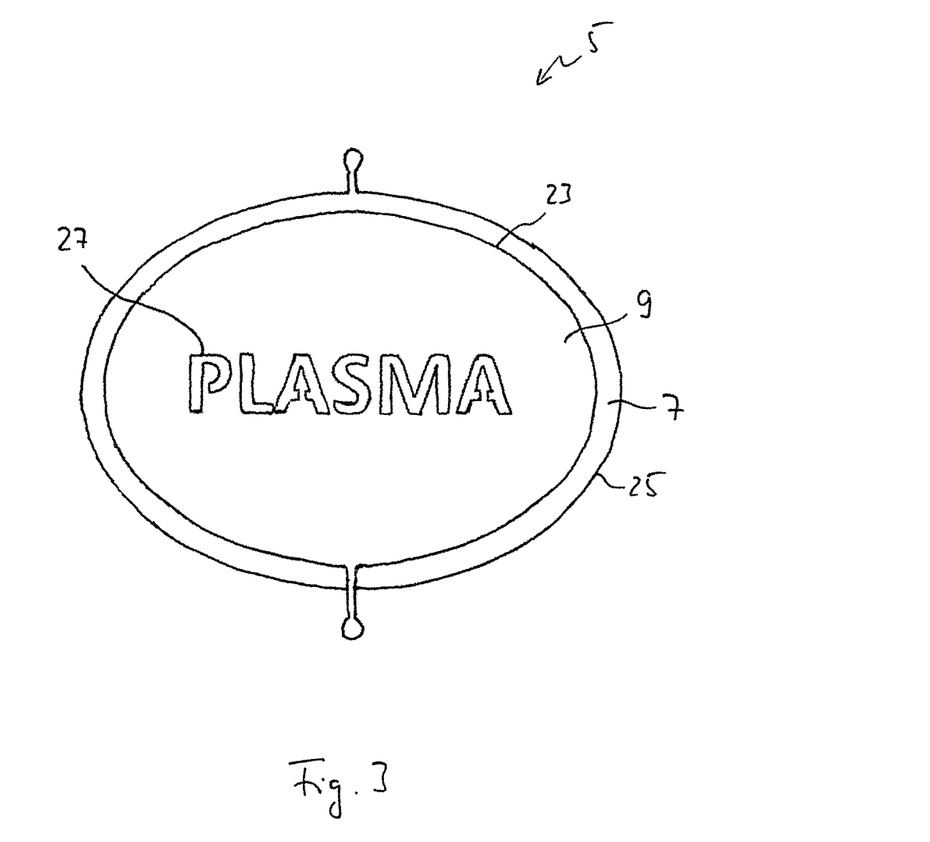
FIG. 3 shows another exemplary embodiment of an electrode arrangement, in particular with regard to a structure of the second electrode.

FIG. 3 shows a schematic representation of another exemplary embodiment 5 of the electric arrangement, in particular with respect to another possible design of the second electrode 9. Equivalent and functionally equivalent elements are provided with the same reference numbers; reference is therefore accordingly made to the preceding description. In the exemplary embodiment portrayed here, the first electrode 7, viewed in the perspective of the viewer, i.e., perpendicular to the plane of drawing in FIG. 3, is arranged below the second electrode 9, wherein it projects beyond a first outer margin 23 of the second electrode 9 viewed in the perspective of the viewer, i.e., in the plane of drawing in FIG. 3, so that a second outer margin 25 of the first electrode 7 laterally extends beyond the second electrode 9. The dielectric element 11 is not portrayed in FIG. 3 for the sake of clarity. However in the electrode arrangement 5, it is arranged between the first electrode 7 and the second electrode 9 in the stack direction, i.e., perpendicular to the plane of the drawing in FIG. 3, wherein it projects beyond the first outer margin 23 of the first electrode 9 as well is the second outer margin 25 of the first electrode 7.

In the configuration depicted here, in particular with regard to the first outer margin 23 of the second electrode 9 and the second outer margin 25 of the first electrode 7, surface microdischarges can form, in particular in the region of the first outer margin 23 of the second electrode 9 as well. If, in another exemplary embodiment, the first outer margin 23 of the second electrode 9 laterally extends beyond the second outer margin 25 of the first electrode 7, there are no surface microdischarges at the first outer margin 23 of the second electrode 9.

In the exemplary embodiment portrayed here, the second electrode 9 is designed flat and has a plurality of recesses 27 of which only one recess is identified with reference number 27 to improve clarity. The recesses 27 are in particular designed as penetrations in the surface of the second electrode 9. When the electrode arrangement 5 is operating, surface microdischarges form in particular at edges of the recesses 27. It can be seen that the recesses 27 in this case form symbols accessible to human understanding or comprehensible to human understanding, i.e., letters, wherein the recesses 27 together form a word, i.e., the word "plasma". Analogously, such recesses 27 in the second electrode 9 can form other words, numbers, combinations of letters and numbers, pictograms, pictures, faces, logos etc.

In particular, the edges of the recesses 27 are preferably at a distance from each other that is at least a 0.5 mm. In this manner, attenuated surface microdischarges can be generated with optimum efficiency at the edges of the recess 27.

Overall, it can be seen that with the electrode arrangement 5 proposed here, the plasma source 1 and the method allow significant miniaturization with great design freedom for a device to generate a nonthermal plasma and/or for plasma treatment, in particular of surfaces, wherein electrical safety of the device is increased, and wherein a treatment distance can always be selected within wide ranges that is always appropriate for a plasma chemistry desired for the specific use.

The invention claimed is:

1. An electrode arrangement for generating a nonthermal plasma, comprising:
   a first electrode and a second electrode that are electrically insulated from each other and spaced from each other in a stack direction of the electrodes by a dielectric element, the first and second electrodes being disposed on opposite sides of the dielectric element along the stack direction,
   wherein the first electrode, in the stack direction, has a thickness of at least 10 µm,
   wherein the second electrode, in the stack direction, has a thickness of at least 1 µm to at most 30 µm,
   wherein the dielectric element, in the stack direction, has a thickness of at least 10 µm to at most 250 µm, and
   wherein the first and the second electrodes are continuously spatially separated in the stack direction by the dielectric element from each other without interruption along an entire extension of the dielectric element.

2. The electrode arrangement according to claim 1, wherein the second electrode, in the stack direction, has a thickness of at least 1 µm to at most 5 µm.

3. The electrode arrangement according to claim 1, wherein the first electrode has a dielectric base element on a side facing away from the dielectric element.

4. The electrode arrangement according to claim 1, wherein at least one electrode, selected from the first electrode and the second electrode, has a material including copper, silver, gold or aluminum.

5. The electrode arrangement according to claim 1, wherein the dielectric element has a material including silicon nitride, a silicate, a glass or a plastic.

6. The electrode arrangement according to claim 5, wherein the dielectric element is made of quartz.

7. The electrode arrangement according to claim 5, wherein the dielectric element is made of a polyamide.

8. The electrode arrangement according to claim 1, wherein the first electrode is flat.

9. The electrode arrangement according to claim 1, wherein the second electrode has a comb-like structure, a linear structure with at least one imaginary line, a winding structure, a spiral structure, a meandering structure or a flat structure with at least one recess.

10. The electrode arrangement according to claim 1, wherein the dielectric element has an average surface roughness (Ra) that is less than 5% of the thickness of the element.

11. A plasma source for generating a nonthermal plasma with a voltage source and an electrode arrangement according to claim 1, wherein the voltage source is electrically connected at least to the first electrode.

12. The plasma source according to claim 11, wherein the voltage source is an AC voltage source, and wherein the second electrode is earthed or grounded.

13. The plasma source according to claim 11, wherein the plasma source is configured to generate AC voltage with an amplitude of at least 0.5 kVpp to at most 3 kVpp.

14. The plasma source according to claim 11, wherein the plasma source has a piezoamplifier.

15. The electrode arrangement according to claim 1, wherein the second electrode in the stack direction has a thickness of at least 5 µm to at most 30 µm.

16. The electrode arrangement according to claim 1, wherein the second electrode has a dielectric cover element on a side facing away from the dielectric element, which dielectric cover element in the stack direction has a thickness of at least 0.2 µm to at most 30 µm.

17. The electrode arrangement according to claim 16, wherein the dielectric cover element has a material including silicon nitride, a silicate, a glass or a plastic.

18. A method for operating a plasma source, comprising providing an electrode arrangement comprising
   a first electrode and a second electrode that are electrically insulated from each other and spaced from each other in a stack direction by a dielectric element, the first and second electrodes being disposed on opposite sides of the dielectric element along the stack direction,
   wherein the first electrode, in the stack direction, has a thickness of at least 10 µm,
   wherein the second electrode, in the stack direction, has a thickness of at least 1 µm to at most 30 µm,
   wherein the dielectric element, in the stack direction, has a thickness of at least 10 µm to at most 250 µm, and
   wherein the first and the second electrodes are continuously spatially separated in the stack direction by the dielectric element from each other without interruption along an entire extension of the dielectric element; and
applying by means of a voltage source an electrical voltage to the electrode arrangement to generate a nonthermal plasma.

19. The method according to claim 18, wherein applying the electrical voltage includes applying an AC voltage with an amplitude of at least 0.5 kVpp to at most 3 kVpp.

20. The method according to claim 18, wherein applying the electrical voltage includes applying an AC voltage having a frequency of at least 20 kHz to at most 90 kHz.

* * * * *